United States Patent [19]

Honda et al.

[11] Patent Number: 5,994,429
[45] Date of Patent: *Nov. 30, 1999

[54] HALOGEN-FREE FLAME-RETARDANT EPOXY RESIN COMPOSITION

[75] Inventors: Nobuyuki Honda, Tokyo; Tsuyoshi Sugiyama, Yokohama, both of Japan

[73] Assignee: Toshiba Chemical Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/737,173
[22] PCT Filed: Jan. 12, 1996
[86] PCT No.: PCT/JP96/00032
   § 371 Date: Nov. 7, 1996
   § 102(e) Date: Nov. 7, 1996
[87] PCT Pub. No.: WO96/28511
   PCT Pub. Date: Sep. 19, 1996

[30] Foreign Application Priority Data

Mar. 10, 1995 [JP] Japan ................................ 7-079739
Apr. 3, 1995 [JP] Japan ................................ 7-101737

[51] Int. Cl.$^6$ .................................................. C08L 63/02
[52] U.S. Cl. .......................... 523/451; 523/200; 523/205; 523/208; 523/210; 428/413; 428/415; 428/416; 428/417; 428/418; 428/402.21
[58] Field of Search ................................ 523/200, 205, 523/208, 210, 451; 428/413, 415, 416, 417, 418, 402.21

[56] References Cited

U.S. PATENT DOCUMENTS

| | | | |
|---|---|---|---|
| 3,477,982 | 11/1969 | Dijkstra et al. | 523/451 |
| 4,145,369 | 3/1979 | Hira et al. | 528/89 |
| 4,868,059 | 9/1989 | Walker et al. | 428/416 |
| 4,879,067 | 11/1989 | Sakon et al. | 252/609 |
| 5,476,884 | 12/1995 | Kayaba et al. | 523/443 |
| 5,859,097 | 1/1999 | Bruynseels et al. | 523/451 |
| 5,869,553 | 2/1999 | Ueda | 523/451 |

FOREIGN PATENT DOCUMENTS

| | | |
|---|---|---|
| 0290095 | 11/1988 | European Pat. Off. . |
| 0428863 | 5/1991 | European Pat. Off. . |

OTHER PUBLICATIONS

Derwent Abstracts 91–157381, "Fire Retardant Aromatic Polyepoxide Composition", May 1991.
Derwent Abstracts 90–196912, "Flame Retardant Phenol Resin Prepreg ", May 1990.
Obera et al., Chemical Abstracts, vol. 111, No. 18, abstract No.155117, Oct. 30, 1989 (Exhibit 3) ; and.
Ichiro et al., Patent Abstracts of Japan, vol. 11, No. 200, Jun. 27, 1987 (Exhibit 4).

*Primary Examiner*—Frederick Krass
*Attorney, Agent, or Firm*—John P. White; Cooper & Dunham LLP

[57] ABSTRACT

A halogen-free flame retardant epoxy resin composition containing (A) a bisphenol A type epoxy resin, (B) a curing agent, (C) red phosphorus particles each of which is covered with a covering layer, at least the outermost layer of which is formed of a resin, and (D) an inorganic filler.

30 Claims, No Drawings

HALOGEN-FREE FLAME-RETARDANT EPOXY RESIN COMPOSITION

This application is a 371 of PCT/JP96/00032 filed Jan. 12, 1996.

TECHNICAL FIELD

The present invention relates to a halogen-free flame-retardant epoxy resin composition, a prepreg containing the epoxy resin composition, and a laminate, copper-clad laminate and printed wiring board which are formed by using the prepregs.

BACKGROUND OF ART

Recently, as world-wide environmental problems and safety to a human body arouse concern, it has been increasingly required that electric/electronic products be less harmful and more safe, in addition to flame retardancy requirement. More specifically, the electric/electronic products are needed hardly to burn and scarcely to generate a harmful gas and fume. Conventional printed wiring boards, on which electric/electronic products are to be mounted, usually have a substrate formed of glass-epoxy. Generally, a brominated epoxy resin, in particular, a tetrabromobisphenol A type epoxy resin, containing bromine which serves as a flame-retardant, is used as the epoxy resin in the substrate.

Such a brominated epoxy resin has good flame retardance. However, it generates a harmful hydrogen halide (hydrogen bromide) gas when burned. For this reason, the use of the brominated epoxy resin is being suppressed. In the circumstances, compositions have been developed, in which a non-halogen flame-retardant such as a nitrogen compound, phosphorus compound or an inorganic compound is added to the conventional epoxy resin (see, for example, British Patent No. 1,112,139 and Jpn. Pat. Appln. KOKAI Publication No. 2-269730). However, these additives imparting flame retardance have problems: they impose undesirable effects on curing of the epoxy resin, decrease the moisture vapor resistance of the cured composition, and impair impregnation of the composition into a glass cloth.

Another feature which is important equally to the flame retardance, and which the printed wiring board should have in view of safety improvement, is tracking resistance. The tracking resistance is particularly required for a substrate having a high voltage circuit, such as a printed wiring board for use in air conditioners and televisions.

To impart the tracking resistance, a chain hydrocarbon, a cyclic compound or an inorganic material has been added to a resin composition for use in the printed wiring board, as a substance which is hardly carbonized. However, these substances are disadvantageous in that the chain hydrocarbon and cyclic compound reduce heat resistance of the printed wiring board, and the inorganic material must be used in a large amount.

Accordingly, an object of the present invention is to provide an epoxy resin composition which exhibits good flame retardance, without containing and also good tracking resistance.

Another object of the present invention is to provide a prepreg impregnated with such an epoxy resin, as well as a laminate, copper-clad laminate and printed wiring board which are formed by using the prepregs.

DISCLOSURE OF THE INVENTION

To attain the aforementioned objects, the present invention provides a halogen-free flame-retardant epoxy resin composition comprising (A) a bisphenol A type epoxy resin, (B) a curing agent, (C) red phosphorus particles each of which is covered with a covering layer, with at least the outermost layer of the covering layer being formed of a resin, and (D) an inorganic filler.

The present invention further provides a prepreg impregnated with the halogen-free flame-retardant epoxy resin composition of the invention, and provides a laminate, copper-clad laminate and printed wiring board which are formed by using the prepregs. The prepreg of the present invention comprises a glass substrate impregnated with the epoxy resin composition of the present invention. The laminate of the present invention comprises a plurality of prepregs of the present invention laminated one over another, in which the epoxy resin composition is cured. The copper-clad laminate of the present invention comprises a laminate of the invention having a copper foil clad on at least one surface thereof. The printed wiring board of the present invention comprises the copper-clad laminate of the present invention having a wiring layer formed in the copper foil.

BEST MODE FOR CARRYING OUT THE INVENTION

The present invention will be explained in detail below.

The epoxy resin composition of the present invention contains a bisphenol A type epoxy resin as component (A). The bisphenol A type epoxy resin is a reaction product of bisphenol A with epichlorohydrin or the like, as is well known in the art. The bisphenol A type epoxy resin used in the present invention usually has an epoxy equivalent of 170 or more. The epoxy equivalent is preferred not to exceed 1000, since a glass cloth fails to be impregnated sufficiently with the resultant composition. Such a bisphenol A type epoxy resin is commercially available, such as those under a trade name of EPIKOTE series obtainable from Yuka Shell, Japan, and ARALDITE series obtainable from CIBA-GAIGY. The bisphenol A type epoxy resin can be used either alone or in combination of two or more of these.

Component (B) of the epoxy resin composition of the present invention is a curing agent. The curing agent (B) may be any curing agent which is conventionally employed as the curing agent for an epoxy resin. Such a curing agent includes an amine curing agent and a phenolic curing agent. Examples of the amine curing agent include dicyandiamide, aromatic amines (e.g., benzylamines). Examples of phenolic curing agent include a phenol novolak resin, cresol novolak resin, bisphenol A type novolak resin and the like.

Component (C), a characteristic component of the epoxy resin composition of the present invention, comprises red phosphorus particles covered with at least a resin. It has been found by the present inventors that the covered red phosphorus particles not only serve as an agent for imparting flame retardance to the epoxy resin composition, but also impart tracking resistance to the printed wiring board formed by using the epoxy resin composition of the present invention. The red phosphorus particles are preferred to have an average diameter of 200 μm or less and to have a spherical shape. The covering layer covering each red phosphorus particle is constituted in at least its outermost layer by a resin, particularly, a thermoset resin. The coating with the resin improves the moisture vapor resistance of the red phosphorus particles. It is preferred that each of the red phosphorus particles be covered with double layers. The first layer is constituted by particles of inorganic material adhering to the surface of the red phosphorus particle. The second layer, which covers the first layer, is constituted by a resin, particularly, a thermoset resin. The inorganic particles constituting the first layer are preferably formed of aluminium hydroxide and/or zinc hydroxide particles. The thermoset resin constituting the second layer is formed from a thermosetting resin such as phenol/formaldehyde resin, urea/ formaldehyde resin, melamine/formaldehyde resin, furfuryl alcohol/formaline resin, aniline/formaldehyde resin. The covered red phosphorus particles per se, as well as a preparation thereof are disclosed in Jpn. Pat. Appln. KOKOKU Publication Nos. 4-37862 and 6-27217. Stated briefly, white phosphorus is heat-treated to convert it into red phosphorus in the form of spherical particle. Then, the spherical red phosphorus particles are suspended in water. To the aqueous suspension is added an aqueous solution of a water soluble salt of aluminium or zinc (for example, aluminium sulfate, aluminium chloride, zinc sulfate, zinc chloride). By neutralization with sodium hydroxide or double decomposition with ammonium bicarbonate, aluminium hydroxide or zinc hydroxide is allowed to adsorb onto each of the red phosphorous particles. The amount of hydroxide is preferably 1 to 30 parts by weight based on the 100 parts of red phosphorus. To the aqueous suspension of the red phosphorus particles covered with the hydroxide, the raw material of the aforementioned thermosetting resin or an initial condensation product thereof is added and then heat-treated. As a result, the second layer formed of the cured resin is obtained. The amount of the resin covering layer is preferably 1 to 30 parts by weight based on 100 parts by weight of the red phosphorus particles.

Component (D) contained in the epoxy resin composition of the present invention is an inorganic filler, which additionally imparts flame retardance, heat resistance, and moisture vapor resistance to the epoxy resin composition. Examples of such a filler include talc, silica, alumina, aluminium hydroxide, magnesium hydroxide powder and the like. There fillers may be used either alone or in combination of two or more.

In the epoxy resin composition of the present invention, it is preferred that a resin constituent (component (A)+ component (B)) be used in an amount of 50 to 90% by weight based on the overall weight of components (A), (B), (C) and (D). It is therefore preferred that the sum of component (C) and (D) be 50 to 10% by weight of the overall weight of components (A), (B), (C) and (D). Component (C), namely, the covered red phosphorus, is preferably used in an amount of 0.5 to 20% by weight based on the overall weight of components (A), (B), (C) and (D).

In the case where component (B) serving as a curing agent for the epoxy resin is a phenolic curing agent, the epoxy resin component (component (A)) and the phenolic resin curing agent are preferably incorporated such that 0.8 to 1.2 epoxy equivalents, more preferably 0.95 to 1.05 epoxy equivalents exist per hydroxyl equivalent of the phenolic curing agent. In the case where component (B) serving as a curing agent for the epoxy resin is an amine curing agent, the amine curing agent is preferably used within the range of 1 to 10% by weight of the weight of epoxy resin component (A). In particular, if the amine curing agent is dicyandiamide, it may be preferred to use the curing agent within the range of 2 to 3% by weight of the weight of epoxy resin component (A).

It should be noted that the epoxy resin composition of the present invention may contain a curing accelerator to shorten curing time of the composition. As such a curing accelerator, any agent may be used as long as it is generally used in accelerating curing of an epoxy resin. Examples of the curing accelerator include imidazole compounds such as 2-ethyl-4-methylimidazole and 1-benzyl-2-methylimidazole. These curing accelerators may be used either alone or in combination of two or more. The curing accelerator can be used in a small amount sufficient to accelerate curing of the epoxy resin.

Using the epoxy resin composition of the present invention explained above, a prepreg can be prepared by a conventional method comprising the steps of diluting the epoxy resin composition with a suitable organic solvent such as propylene glycol monomethyl ether to make a varnish, and coating and impregnating a porous glass substrate such as non-woven glass fabric or glass cloth with the varnish, followed by heating. Furthermore, a glass-epoxy copper-clad laminate can be prepared by laying a plurality of prepregs on over another to form a laminate structure, placing a copper foil onto either one or both surfaces of the laminate structure, heating and pressurizing the resultant structure under conventional conditions. In this case, if copper foil is not employed, a laminate will be obtained. A multilayer board can be obtained by a conventional method comprising the steps of forming a circuit in the copper-clad laminate (inner layer board), etching the copper foil, laminating prepregs and copper foil onto at least one of two surfaces of the inner layer board, heating and pressurizing the structure thus obtained, for example, at 170° C. under a pressure of 40 kg/cm$^2$ for 90 minutes. Furthermore, the printed wiring board can be obtained by a conventional method comprising the steps of forming through-holes in the copper-clad laminate or multilayer board, plating the through-holes, and forming a predetermined circuit.

The present invention will be explained with reference to Examples below.

EXAMPLE 1

An epoxy resin varnish mixture having a resin solid content of 65% by weight was prepared by adding propylene glycol monomethyl ether (PGM) as a solvent to a mixture of 260 parts by weight of bisphenol A type epoxy resin, EPIKOTE 1001 (manufactured by Yuka Shell, epoxy equivalent: 456, resin solid content: 70% by weight), 65 parts by weight of cresol novolak epoxy resin, YDCN-704P (manufactured by Totokasei, epoxy equivalent: 210, solid content: 70% by weight), 25 parts by weight of covered red phosphorus particles (covered with aluminium hydroxide and phenol resin, a red phosphorus content: 85% by weight), 104 parts by weight of bisphenol A type novolak resin (hydroxyl value: 118, solid content: 70% by weight), 175 parts by weight of aluminium hydroxide, and 0.1 part by weight of 2-ethyl-4-methylimidazol.

EXAMPLE 2

An epoxy resin varnish mixture having a resin solid content of 65% by weight was prepared by adding PGM to a mixture of 260 parts by weight of bisphenol A type epoxy resin, EPIKOTE 1001 (described above), 65 parts by weight of cresol novolak epoxy resin, YDCN-704P (described above), 50 parts by weight of covered red phosphorus particles (covered with aluminium hydroxide and phenol resin, a red phosphorus content: 85% by weight), 104 parts by weight of bisphenol A type novolak resin (hydroxyl value: 118, solid content: 70% by weight), 100 parts by weight of aluminium hydroxide, and 0.1 part by weight of 2-ethyl-4-methylimidazol.

EXAMPLE 3

An epoxy resin varnish mixture having a resin solid content of 65% by weight was prepared by adding PGM to a mixture containing 260 parts by weight of bisphenol A type epoxy resin, EPIKOTE 1001 (described above), 65 parts by weight of cresol novolak epoxy resin, YCDN-704P (described above), 35 parts by weight of covered red phosphorus particles (covered with aluminium hydroxide and phenol resin, a red phosphorus content: 85% by weight), 115 parts by weight of aluminium hydroxide, and 6 parts by weight of dicyandiamide.

Comparative Example 1

An epoxy resin varnish mixture having a resin solid content of 65% by weight was prepared by adding PGM to a mixture of 283 parts by weight of a brominated epoxy resin (manufactured by Dainippon Ink and Chemicals, Inc., epoxy equivalent: 490, solid content: 75% by weight), 34 parts by weight of cresol novolak epoxy resin, YCDN-704P (described above), 92 parts by weight of bisphenol A type novolak resin (manufactured by Dainippon Ink and Chemicals, Inc., hydroxyl value: 118, solid content: 70% by weight), 200 parts by weight of aluminium hydroxide, and 0.1 part by weight of 2-ethyl-4-methylimidazole.

Comparative Example 2

An epoxy resin varnish mixture having a resin solid content of 65% by weight was prepared by adding dimethylformamide to a mixture of 360 parts by weight of the brominated epoxy resin used in Comparative Example 1, 43 parts by weight of cresol novolak epoxy resin, YCDN-704P (described above), 7.5 parts by weight of dicyandiamide, 200 parts by weight of aluminium hydroxide, and 0.1 part by weight of 2-ethyl-4-methylimidazole.

Non-woven glass fabrics or glass clothes were continuously coated and impregnated with each of the epoxy resin varnish mixtures obtained in Examples 1 to 3 and Comparative Examples 1 and 2. The resultant fabrics were dried at a temperature of 160° C., thereby forming prepreg sheets. Eight prepreg sheets were superposed one upon another and 18 μm-thick copper foil was placed on both surfaces of the resultant structure. The laminated structure was subjected to heating/pressurizing treatment at a temperature of 170° C. under a pressure of 40 kg/cm² for 90 minutes. As a result, a glass-epoxy copper-clad laminate of 1.6 mm in thickness was obtained.

The copper-clad laminate were examined for flame retardance, tracking resistance, insulation resistance, peeling strength of copper foil at initial time and after aging, heat resistance and moisture-vapor resistance. The results are shown in Table 1.

TABLE 1

| Composition | | Examples | | | Comparative Examples | |
|---|---|---|---|---|---|---|
| Characteristics | | 1 | 2 | 3 | 1 | 2 |
| Flame-retardance *1 | | V-0 | V-0 | V-1 | V-0 | V-0 |
| Tracking resistance *2 | | 600V | 600V | 600V | 200V | 200V |
| Insulation resistance (Ω) *3 | | $8.0 \times 10^{12}$ | $4.0 \times 10^{12}$ | $1.0 \times 10^{12}$ | $2.0 \times 10^{12}$ | $2.0 \times 10^{12}$ |
| Peeling | Initial | 1.50 | 1.50 | 1.55 | 1.50 | 1.60 |
| strength *4 | After aging | 1.45 | 1.40 | 1.45 | 0.90 | 0.95 |
| Heat | 5 minutes | ⊚ | ⊚ | ⊚ | ⊚ | ⊚ |
| resistance | 10 minutes | ⊚ | ⊚ | ⊚ | ⊚ | ⊚ |
| *5 | 15 minutes | ⊚ | ⊚ | ⊚ | ⊚ | ○ |
| | 20 minutes | ⊚ | ⊚ | ⊚ | ○ | Δ |
| Moisture vapor | Condition A | ⊚ | ⊚ | ⊚ | ⊚ | ⊚ |
| resistance *6 | Condition B | ⊚ | ⊚ | ⊚ | ⊚ | ○ |

Note
*1: measured in accordance with a UL 94 flame retardance test.
*2: measured in accordance with IEC-PB 112.
*3: measured in accordance with JIS-C-6481.
*4: measured in accordance with JIS-C-6481 (unit: KN/m).
*5: Specimens were floated in a solder bath of 260° C. for a time period shown in Table. Blister was observed and evaluated in accordance with the following standards:
○ . . . no blister was observed;
⊚ . . . blister was observed partially;
Δ . . . blister was observed for the most part;
x . . . blister was observed entirely.
*6: Specimens were treated under condition A (boiling for 6 hours) or condition B (standing still in water vapor at 120° C. under 2 atm for 7 hours) and immersed in a solder bath of 260° C. for 30 seconds. Thereafter, blister was observed and evaluated in accordance with the following standards:
○ . . . no blister was observed;
⊚ . . . blister was observed partially;
Δ . . . blister was observed for the most part;
x . . . blister was observed entirely.

EXAMPLE 4

Non-woven glass fabrics or glass clothes were continuously coated and impregnated with the epoxy resin varnish mixture obtained in Example 2. The resultant fabrics were dried at a temperature of 160° C., thereby preparing prepregs. Eight prepreg sheets thus obtained were laid one over another and subjected to heating/pressurizing treatment at a temperature of 170° C. under a pressure 40 kg/cm² for 90 minutes. As a result, a glass-epoxy laminate was obtained.

EXAMPLE 5

Prepregs were obtained in the same manner as in Example 4. These prepreg sheets were superposed upon another and 35 μm-thick copper foil was placed on both surfaces of the prepreg sheet construct. The resultant structure was subjected to the same heating/pressurizing treatment as in Example 4. As a result, an inner layer board of 0.8 mm in thickness was obtained. On each of the two surfaces of the inner layer board thus obtained, the prepreg obtained above was placed. Furthermore, 18 μm-thick copper foil was placed on each prepreg. The heating/pressurizing treatment was applied to the resultant structure in the same manner as above, thereby forming a multilayer board of 1.6 mm in thickness.

As described above, according to the present invention, there is provided an epoxy resin composition which exhibits a superior flame retardance, without containing halogens, and can provide a glass epoxy copper-clad laminate having an excellent heat resistance, moisture vapor resistance and tracking resistance. Furthermore, using such a glass-epoxy copper-clad laminate, a printed wiring board excellent in various properties can be obtained.

We claim:

1. A halogen-free flame retardant epoxy resin composition comprising (A) a bisphenol A epoxy resin, (B) dicyandiamide curing agent, (C) red phosphorus particles each of which is covered with a covering layer, at least an outermost layer of which is formed of a resin, and (D) an inorganic filler, wherein each of said red phosphorus particles is covered with a double layer consisting of a first layer made of aluminum hydroxide or zinc hydroxide and a second layer made of phenolic resin, formed on said first layer.

2. The composition according to claim 1, wherein said bisphenol A epoxy resin has an epoxy equivalent of 170 to 1000.

3. The composition according to claim 1, wherein said components (A) and (B) are contained in total in an amount of 50 to 90% by weight of the overall weight of components (A), (B), (C) and (D).

4. The composition according to claim 1, wherein said component (C) is contained in an amount of 0.5 to 20% by weight based on the overall weight of component (A), (B), (C) and (D).

5. A prepreg comprising a glass substrate impregnated with an epoxy resin composition according to claim 1.

6. A laminate comprising a plurality of prepregs of claim 5, which are laminated, wherein said epoxy resin composition is cured.

7. A copper-clad laminate comprising a substrate formed of the prepreg of claim 5, with said epoxy resin composition being cured, and a copper foil joined to at least one surface of said substrate.

8. A printed wiring board comprising a substrate formed of the prepreg of claim 5, with said epoxy resin composition being cured, and a wiring layer formed on at least one surface of said substrate.

9. The composition according to claim 2, wherein each of said red phosphorus particles is covered with a double layer consisting of a first layer made of aluminum hydroxide or zinc hydroxide and a second layer made of phenol-formaldehyde resin, formed on said first layer.

10. The composition according to claim 9, wherein said components (A) and (B) are contained in total in an amount of 50 to 90% by weight of the overall weight of components (A), (B), (C) and (D).

11. The composition according to claim 10, wherein said component (C) is contained in an amount of 0.5 to 20% by weight based on the overall weight of component (A), (B), (C) and (D).

12. A prepreg comprising a glass substrate impregnated with an epoxy resin composition according to claim 11.

13. A laminate comprising a plurality of prepregs of claim 12, which are laminated, wherein said epoxy resin composition is cured.

14. A copper-clad laminate comprising a substrate formed of the prepreg of claim 12, with said epoxy resin composition being cured, and a copper foil joined to at least one surface of said substrate.

15. A printed wiring board comprising a substrate formed of the prepreg of claim 12, with said epoxy resin composition being cured, and a wiring layer formed on at least one surface of said substrate.

16. A halogen-free flame retardant epoxy resin composition comprising (A) a bisphenol A epoxy resin, (B) dicyandiamide curing agent, (C) red phosphorus particles each of which is covered with a covering layer, at least an outermost layer of which is formed of a resin, and (D) an inorganic filler, wherein each of said red phosphorus particles is covered with a double layer consisting of a first layer made of aluminum hydroxide or zinc hydroxide, and a second layer formed on said first layer and made of a resin selected from the group consisting of a phenol/formaldehyde resin, a urea/formaldehyde resin, a melamine/formaldehyde resin, furfuryl alcohol/formaldehyde resin, and aniline/formaldehyde resin.

17. A copper-clad laminate comprising:

a laminate comprising a plurality of prepregs each formed of a glass substrate pre-impregnated with a halogen-free flame retardant epoxy resin composition comprising (A) a bisphenol A epoxy resin, (B) a phenolic curing agent, (C) red phosphorus particles each of which is covered with a double layer consisting of a first layer made of aluminum hydroxide or zinc hydroxide, and a second layer formed on said first layer and made of a resin selected from the group consisting of a phenol/formaldehyde resin, a urea/formaldehyde resin, a melamine/formaldehyde resin, furfuryl alcohol/formaldehyde resin, and aniline/formaldehyde resin, and (D) an inorganic filler; and a copper foil joined to at least one surface of said laminate.

18. The copper-clad laminate according to claim 17, wherein said bisphenol A epoxy resin has an epoxy equivalent of 170 to 1000.

19. The copper-clad laminate according to claim 17, wherein said components (A) and (B) are contained in total in an amount of 50 to 90% by weight of the overall weight of said components (A), (B), (C) and (D) in said epoxy resin composition.

20. The copper-clad laminate according to claim 17, wherein said component (C) is contained in said epoxy resin composition in an amount of 0.5 to 20% by weight based on the overall weight of said components (A), (B), (C) and (D).

21. The copper-clad laminate according to claim 20, wherein said components (A) and (B) are contained in said epoxy resin composition such that 0.8 to 1.2 epoxy equivalents of component (A) exist per hydroxyl equivalent of component (B).

22. The copper-clad laminate according to claim 17, wherein said component (B) is selected from the group consisting of a phenol novolak resin, cresol novolak resin, and bisphenol A novolak resin.

23. A prepreg comprising a glass substrate impregnated with an epoxy resin composition according to claim 16.

24. A laminate comprising a plurality of prepregs of claim 23, which are laminated, wherein said epoxy resin composition is cured.

25. A copper-clad laminate comprising a substrate formed of the prepregs of claim 24, and a copper foil joined to at least one surface of said substrate.

26. A printed wiring board comprising a substrate formed of the prepregs of claim 24, and a wiring layer formed on at least one surface of said substrate.

27. A halogen-free flame retardant epoxy resin composition to be used in a prepreg, laminate or printed wiring board, comprising:

(A) a bisphenol A epoxy resin;

(B) a phenolic curing agent;

(C) red phosphorus particles each of which is covered with a double layer consisting of a first layer made of aluminum hydroxide or zinc hydroxide, and a second layer formed on said first layer and made of a resin selected from the group consisting of a phenol/ formaldehyde resin, a urea/formaldehyde resin, a melamine/formaldehyde resin, furfuryl alcohol/formaldehyde resin, and aniline/formaldehyde resin; and (D) an inorganic filler.

28. A prepreg comprising a glass substrate impregnated with an epoxy resin composition according to claim 27.

29. A laminate comprising a plurality of prepregs of claim 28, which are laminated, wherein said epoxy resin composition is cured.

30. A printed wiring board comprising a substrate formed of the prepregs of claim 28, and a wiring layer formed on at least one surface of said substrate.

* * * * *